United States Patent [19]

Arakawa et al.

[11] Patent Number: 5,543,712
[45] Date of Patent: Aug. 6, 1996

[54] PARASITIC COMPENSATING MATCHING CIRCUIT INTEGRAL WITH GROUND BREAKER FOR MRI RF COILS

[75] Inventors: Mitsuaki Arakawa, Hillsborough; Ernesto Zepeda, Daly City; William K. M. Lu, San Francisco, all of Calif.

[73] Assignee: The Regents of the University of California, Berkeley, Calif.

[21] Appl. No.: 361,530

[22] Filed: Dec. 22, 1994

[51] Int. Cl.$^6$ ..................................................... G01V 3/00
[52] U.S. Cl. ............................................ 324/318; 324/322
[58] Field of Search ..................................... 324/300, 307, 324/309, 310, 311, 312, 313, 314, 318, 322

[56] References Cited

U.S. PATENT DOCUMENTS

| | | | |
|---|---|---|---|
| 4,682,125 | 7/1987 | Harrison et al. | 324/318 |
| 4,707,664 | 11/1987 | Fehn et al. | 324/307 |
| 4,740,752 | 4/1988 | Arakawa et al. | 324/318 |
| 4,827,219 | 5/1989 | Harrison | 324/322 |
| 5,357,958 | 10/1994 | Kaufman | 324/318 |
| 5,371,466 | 12/1994 | Arakawa et al. | 324/318 |
| 5,376,885 | 12/1994 | Arakawa et al. | 324/318 |
| 5,386,191 | 1/1995 | McCarten et al. | 324/318 |

OTHER PUBLICATIONS

Gonzalez, G., "Microwave Transistor Amplifiers Analysis and Design," pp. 42–67, Prentice–Hall, Inc., 1984.

*Primary Examiner*—Michael Tokar
*Attorney, Agent, or Firm*—Nixon & Vanderhye P.C.

[57] ABSTRACT

A matching circuit for a RF coil on an MRI device is disclosed. The matching circuit includes a variable neutralizing inductance on the output side of the matching circuit ground breaker. All variable components are removed from the coil trace board, providing greater access to the tuning components during the MRI operation.

9 Claims, 8 Drawing Sheets

PARASITIC COMPENSATING MATCHING CIRCUIT INTEGRAL WITH GROUND BREAKER FOR MRI RF COILS

FIELD OF THE INVENTION

This invention relates to magnetic resonance imaging devices and in particular to matching circuits used in MRI RF coils having inline ground breakers.

BACKGROUND OF THE INVENTION

MRI devices utilize RF transmitting coils to transmit RF signals to an imaged portion of a body and utilize RF receiving coils to detect RF signals that are received from the imaged portion of the body during an MRI process. These RF coils are used in conjunction with matching circuits to tune the coils to a particular matched impedance, generally 50Ω. These impedance matching circuits include variable passive elements that can be tuned by human adjustment to the matched impedance value. These adjustments are required as a result of the various external factors that will affect the reactive component values in the RF coil and matching circuit.

FIG. 1 shows a basic impedance matching circuit. The RF coil is shown as an inductor on the left side of FIG. 1 in series with resistance $R_s$ that occurs due to losses from the patient and the RF coils themselves. Two variable capacitors, $C_p$ and $C_s$, are added to bring the impedance of the circuit to 50Ω. The capacitors, $C_p$ and $C_s$ are variable to allow for a manual or automatic adjustment to bring the circuit impedance to 50Ω.

Although the circuit is simple enough to be solved by a series of algebraic manipulations to find a real part of the circuit impedance to be 50Ω and the imaginary part of the circuit impedance to be 0Ω, it is much easier to solve for the matching condition using a Smith chart (such as is shown in FIG. 1A).

FIG. 1A is a Smith chart configuration showing the impedance of the matching circuit of FIG. 1. The Smith chart in FIG. 1A illustrates the need for two variable capacitors, $C_p$ and $C_s$, in FIG. 1 to match the impedance to the 50Ω requirement. As is well-known, the Smith chart illustrates normalized impedance (either to 50Ω or 75Ω, although normally for RF and microwave frequencies a 50Ω system is employed) at the center of the circle (1.0)). The impedance of the RF coil before any matching is shown as $Z_{rx}$. In the chart of FIG. 1A, the values L=0.6 µH and Q=10 at 64 MHz were used. The effect of the parallel capacitor $C_p$ brings the impedance closer to the open circuit point (∞) of the Smith chart and the series capacitance $C_s$ brings the impedance shown on the Smith chart to the normalized impedance of 1.0.

As can be seen in FIG. 1A, bringing the impedance point from $Z_{rx}$ to the matched point (1.0) requires both series and parallel capacitance. That is, if only parallel capacitance is added to $Z_{rx}$, the impedance point will rotate counterclockwise past the horizontal line (resistance axis) of FIG. 1A and, ultimately, reach to the short circuit point (0.0). Similarly, adding only series capacitance at $Z_{rx}$ will take the impedance point around (in a counter-clockwise direction) through approximately the 0.5 point then toward the open circuit point (∞). In neither case (using only series or parallel capacitance, but not both) will the impedance point intersect the resonance point (1.0). Thus, both variable parallel capacitance $C_p$ and variable series capacitance $C_s$, are used in the circuit of FIG. 1.

Additional capacitors may also be present on the matched circuit. For high frequency operation, for example, such as is used in MRI procedures, additional capacitors connected in series with the receiver coil segments are advantageous in reducing frequency downshifting due to the contribution of the dielectric characteristics in the load. These additional capacitors are commonly called "distributed capacitors" and are shown in FIG. 2 as $C_d$. In FIG. 2A, distributed capacitance $C_d$ is combined with the variable capacitor $C_p$ and the variable capacitor $C_s$.

FIG. 2C is the corresponding Smith chart for the matching circuit of FIG. 2A. As can be seen in FIG. 2C, the distributed capacitor $C_d$ adds series capacitance to the matching circuit. The parallel and series capacitors are adjusted to achieve the impedance matching requirement shown in FIG. 2C.

As discussed above, in matching circuits of the type shown in FIGS. 1 and 2A, at least two capacitors (one in parallel and one in series) are present and are variable in order to bring the matching circuit to complex conjugate of the load impedance.

FIG. 2B is an alternative matching circuit, which is a variation of the circuit of FIG. 2A. In FIG. 2B, since the capacitors $C_d$ and $C_p$ of FIG. 2A provide the required parallel and series variable capacitances needed to tune the matching circuit, the series capacitor $C_s$ has been removed completely. The configuration in FIG. 2B is simpler and preferred over FIG. 2A. The corresponding Smith chart for the circuit of FIG. 2B is shown in FIG. 2D. Again, the characteristics of the illustration in the Smith chart of FIG. 2D is L=0.6 µH and Q=10 at 64 MHz.

The circuits of FIGS. 1, 2A and 2B do not illustrate the effect of parasitic capacitance in parallel with $C_p$ that may be included in the coil or matching circuit. The effect of the parasitic capacitance can be significant. For example, if the parasitic capacitance value is too large, the impedance of the receiving coil and matching circuit can fall below the horizontal line on the Smith chart. When this happens, variable capacitors $C_d$, $C_s$ or $C_p$ alone cannot tune the circuit to 50Ω.

For example, if parasitic parallel capacitance is present in the circuit of FIG. 2B, the impedance value shown in FIG. 2D will reflect a greater total parallel capacitance value. That, of course, would bring the impedance value shown as resting at 1.0 in FIG. 2D below the horizontal line (moving in a clockwise direction along the same segment identified as "$C_p$" in FIG. 2D). If the parasitic capacitance is small, it can be corrected by removing some of the parallel capacitance contributed by capacitor $C_p$ through its variable adjustment. But, as the parallel parasitic capacitance value exceeds the value of $C_p$ (FIG. 2D), the capacitance contribution from the parallel parasitic capacitance alone will cause the impedance value to fall below the horizontal line in FIG. 2D (through the matched impedance point 1.0). Under those conditions, no amount of reduction in the capacitance $C_p$ will bring the matched circuit back into 50Ω matching.

The following table summarizes typical capacitance values of the three different matching circuits in FIGS. 1, 2A and 2B for an RF receiving coil whose inductance is 0.6 µH and Q is 10 operating at 64 MHz (for a 1.5 T MRI system).

TABLE 1

| CIRCUIT TOPOLOGY | $C_d$ (pF) | $C_p$ (pF) | $C_s$ (pF) |
| --- | --- | --- | --- |
| FIG. 1 | N/A | 3.1 | 7.3 |
| FIG. 2A | 12.5 | 19.7 | 51.4 |
| FIG. 2B | N/A | 51.3 | 11.5 |

As shown in Table 1, the circuit in FIG. 1 requires very small capacitance values that are unsuitable for a circuit having larger parasitic capacitance. Larger capacitance values are more desirable for stable and repeatable matching operations. The circuits in FIGS. 2A and 2B have more reasonable variable capacitance values for situations where parasitic capacitance may be large.

The amount of parasitic capacitance present can depend on the type of circuit board that may be used in the tuning and matching circuit of the RF receiving coil. FR4-based printed circuit material (which has a dielectric constant over 4), for example, may add a large parasitic capacitance to tuning and matching circuits printed on them. On the other hand, circuits that are printed on a teflon/glass substance (such as is marketed under the name "Duroid"), which has a low dielectric constant (of, for example, approximately 2), will exhibit less parasitic capacitance over the same circuitry printed on the FR4-based printed circuit material. Unfortunately, however, the teflon/glass based printed circuit board material is more costly than the FR4-based printed circuit board material. Reducing the cost of the RF coils, while reducing the effect of parasitic capacitance is desirable.

FIG. 6, for example, shows a schematic representation of a RF receiving coil fabricated on a printed circuit board based on the circuit configuration of FIG. 2B. The RF coil shown in FIG. 6 is a representation of a lumbar spine coil for a high frequency MRI. The RF coil assembly 10 includes a RF coil trace board 12 and a matching circuit board 30. The RF coil trace board 12 may be either the FR4- or teflon/glass-type onto which coil 22 is imprinted. The RF coil trace 22 is broken in several places to include series capacitances. At least one of the series capacitance in the coil 22 must be adjustable as shown in FIG. 6. As discussed previously, these adjustable series capacitances allow the user to tune the RF coil matching circuit to the desired impedance.

Certain problems exist in accessing this variable series capacitor in the MRI system. To illustrate this problem, the RF coil assembly 10 shown in FIG. 6 is shown in its MRI application in FIG. 7. Specifically, in FIG. 7, the assembly 10 is included as part of a table 40 within the MRI structure 42. The RF coil assembly 10 includes a surface that is roughly contiguous with the surface of the table 40 such that the patient is provided with a smooth table to lie on during the MRI process. In FIG. 7, however, the surface of the assembly 10 is removed to illustrate the RF coil trace board 12 within a cavity 14.

The coil 22 which is on the upper surface of the RF coil trace board 12 can be seen in FIG. 7. The coil 22 includes an adjustable capacitor in series, as shown in FIG. 6. The adjustment for this capacitor is typically provided at the end of the RF coil assembly 10, and the adjustment is typically accessed by an adjustment hole 16 (FIG. 7).

As can be particularly seen in FIG. 7, once the human body is on the table 40, access to adjustment hole 16 is significantly limited. Nevertheless, as described with respect to the Smith charts above, the series capacitor ($C_s$) must be adjusted to tune the RF coil to the desired frequency. Thus, even though difficult, access to the adjustments 16 is requisite.

In addition, the series capacitance $C_s$ is subjected to very high voltages induced on the RF receiving coil during the RF transmission cycle. Usually, there is not enough space to have a high voltage, non-magnetic variable capacitor on the coil trace board.

The prior matching circuits thus suffered from problems in accessing the variable series capacitance adjustments in the RF receiving coils and problems with arcing across the variable series capacitor.

The schematic diagram for the assembly 10 in FIGS. 6 and 7 is shown in FIG. 4. The RF coil 22 is shown as inductance L, together with the series capacitance $C_s$ and resistance $R_s$ caused by load loss. As described previously, with respect to FIGS. 1, 2A and 2B, the prior art also includes a parallel capacitance $C_p$, as shown in FIG. 4, to adjust the resonance to a typically 50Ω matched impedance. The RF coil trace board 12 and matching board 30 provide an inherent parasitic capacitance $C_{parasitic}$, as shown in FIG. 4. FIG. 4 also shows the RF output connection 60.

A ground breaker 50 is placed on matching board 30 to reduce the unwanted ground loop between the RF coil and the rest of the circuit shown in FIG. 4. A typical ground breaker is made up of a coaxial cable wound as a coil, together with a tuning capacitor connected across the outside conductor of the coaxial cable. This type of ground breaker 50 is described in U.S. Pat. No. 4,682,125 to Harrison et al., which is incorporated herein by reference. The outside conductor of the coaxial cable and the parallel capacitor act as a parallel tuned circuit and exhibit a very high impedance at the resonant frequency. As a result, little RF ground current will flow along the outside of the coaxial cable.

In FIG. 4, for a 64 MHz operation, the inductance of the coaxial cable formed as a coil can be approximately 0.1 μH and the electrical length is 26 degrees, which is about 1/14 wavelength. The value of $C_{parasitic}$ can be approximately on the order of 20 to 30 pF, depending on which type of printed circuit material is used and how the traces on the printed circuit board are laid out.

As is described above, the parasitic capacitance $C_{parasitic}$ can be relatively large that the variable capacitors $C_p$ and $C_s$ can no longer bring the RF coils into a matched impedance condition. In addition, obtaining access to the adjustment 16 to vary the capacitance $C_s$ to obtain a matched impedance condition can be difficult in particular applications.

SUMMARY OF THE INVENTION

The present invention provides a matching circuit which neutralizes the parasitic capacitance on the RF receiving coil trace and matching circuit boards and eliminates the variable capacitor on the RF receiving coil by adding a variable inductor in parallel to the variable matching capacitors $C_p$. With the inclusion of a ground breaker or a transmission line between the parallel capacitor and the variable inductor, the variable inductor can be placed off of the coil trace board, but on the matching board, thereby making accessibility to the matching circuit adjustment mechanisms easier. The variable capacitor $C_s$, that is included in series with the RF coil on the trace board may be replaced with a fixed value capacitor such that the chance of arcing and burning in the variable capacitor is reduced and access to the variable series capacitance adjustments on the coil trace board is no longer necessary. Replacing the variable capacitor with the fixed capacitor also reduces expense.

The variable inductance is included on the output side of the matching circuit to improve access to the variable adjustment mechanism and to eliminate the affect of the parasitic capacitance that may be on the printed circuit board material. As a result, less expensive circuit board material such as FR4, can be used instead of teflon/glass substrate (i.e., Duroid) circuit board material, even though the FR4 material may induce a higher parasitic capacitance.

Providing this variable inductor on the output side of the ground breaker thus overcomes difficulties in designing MRI RF coil matching circuits for high frequency and low Q when relatively high parasitic capacitance is present, and permits the elimination of any variable capacitors on the RF coil trace board.

BRIEF DESCRIPTION OF THE DRAWINGS

The purpose and advantages gained by the present invention will be understood by careful study of the following detailed description of the presently preferred embodiment with particular reference to the accompanying drawings.

DETAILED DESCRIPTION OF THE PRESENTLY PREFERRED EMBODIMENTS

Figure 1:
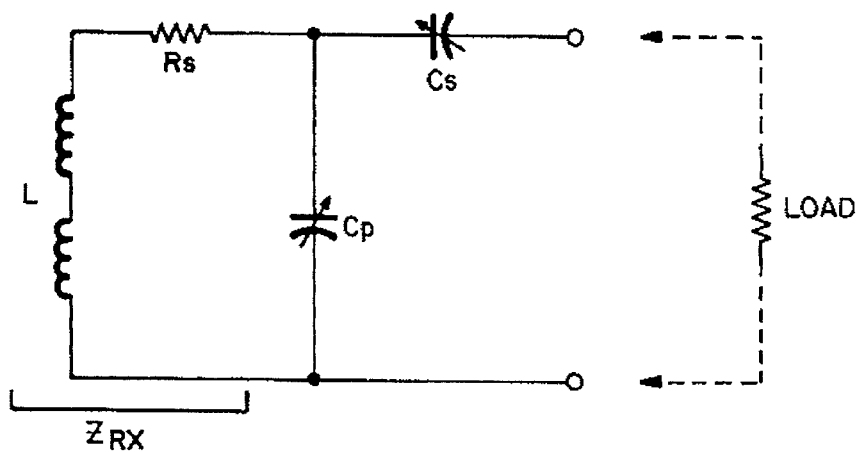
FIG. 1 is a schematic diagram of a prior art matching circuit.
Figure 1A:
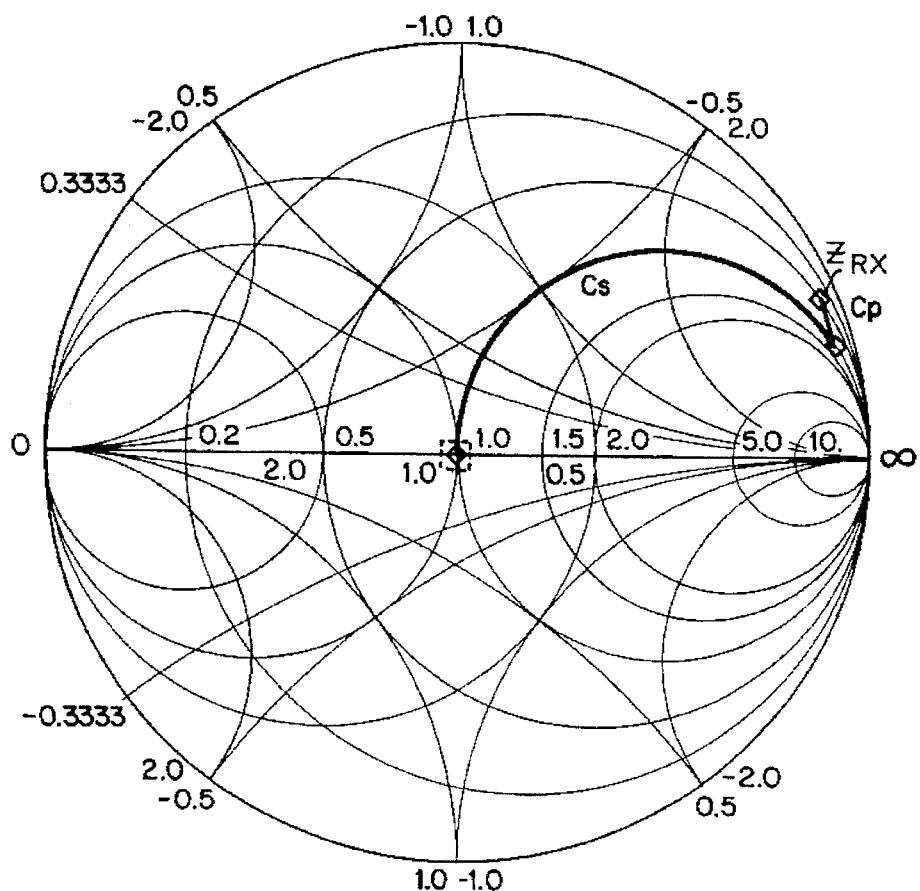
FIG. 1A is a Smith chart rendition of the circuit of FIG. 1.
Figure 2A:
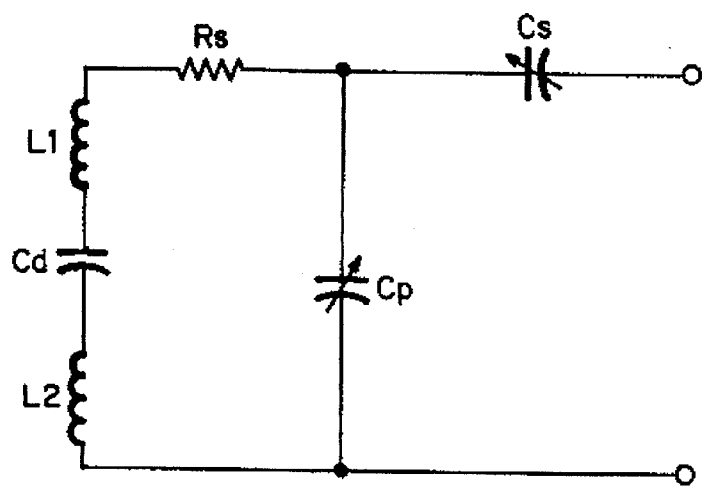
FIG. 2A is a schematic diagram of another prior art matching circuit.
Figure 2B:
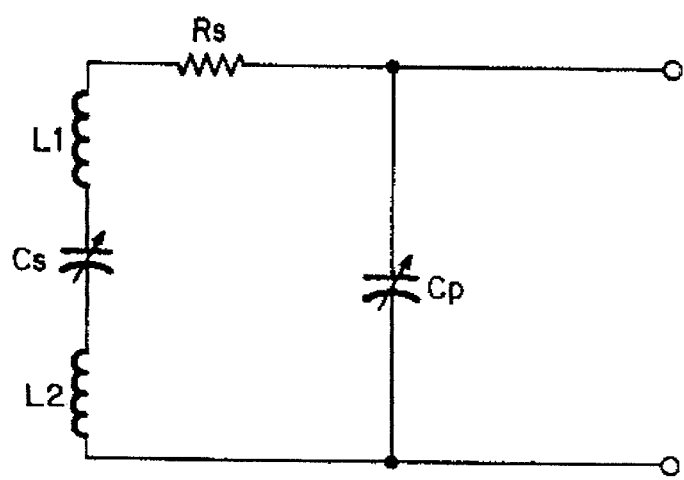
FIG. 2B is a schematic diagram of still another prior art matching circuit.
Figure 2C:
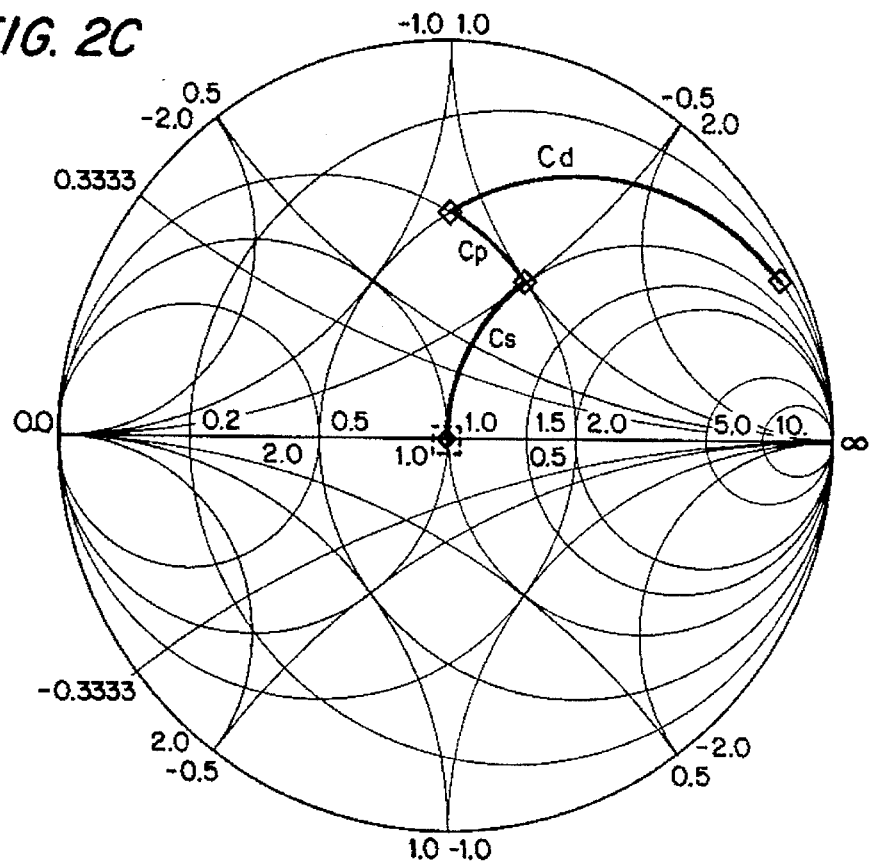
FIG. 2C is a Smith chart rendition of the circuit of FIG. 2A.
Figure 2D:
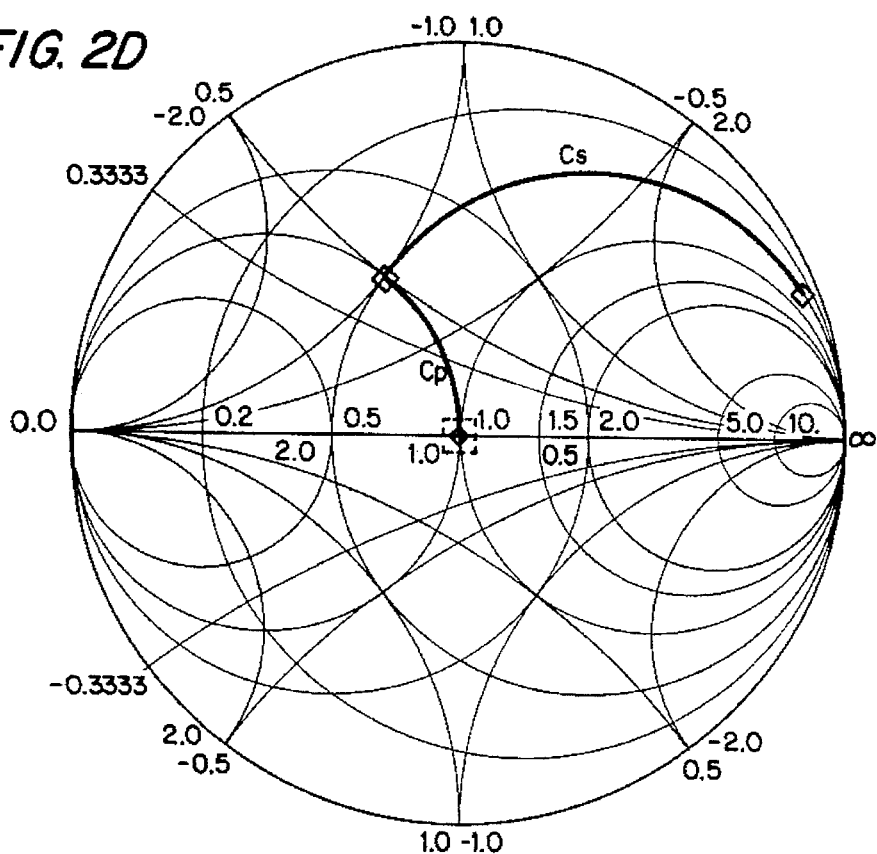
FIG. 2D is a Smith chart rendition of the circuit of FIG. 2B.
Figure 3:
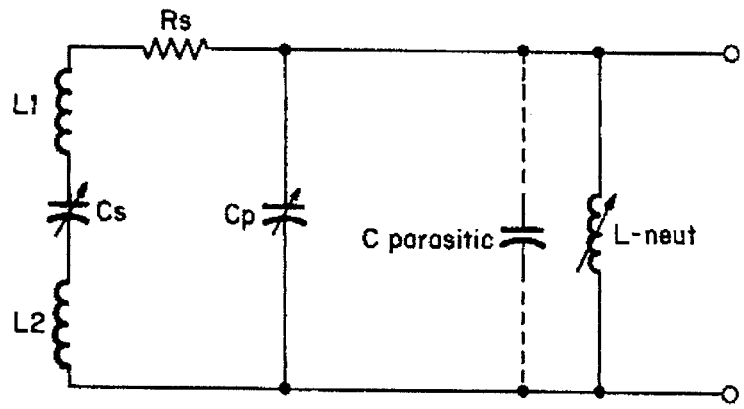
FIG. 3 is a schematic diagram of a matching circuit according to one embodiment of the present invention.

As shown in FIG. 3, the parasitic capacitance that is exhibited in the matching circuit can be nulled out by placing a neutralizing inductor in parallel with the parasitic capacitance. The matching circuit of FIG. 3 includes the variable series capacitance $C_s$, the variable parallel capacitance $C_p$, the parasitic capacitance $C_{parasitic}$, and the variable neutralizing inductance $L_{neut}$. With the neutralizing inductance, the effect of the parasitic capacitances, $C_{parasitic}$ is reduced or eliminated, leaving the series and parallel capacitances, $C_p$ and $C_s$, available to tune the matching circuit to resonance. Of particular importance in the matching circuit of FIG. 3, is the ability of the variable series and variable parallel capacitors, $C_s$ and $C_p$, to tune the matching circuit to a resonant impedance notwithstanding the existence of a large value parasitic capacitance, $C_{parasitic}$ that is inherent on the trace board and matching board.

Figure 5:
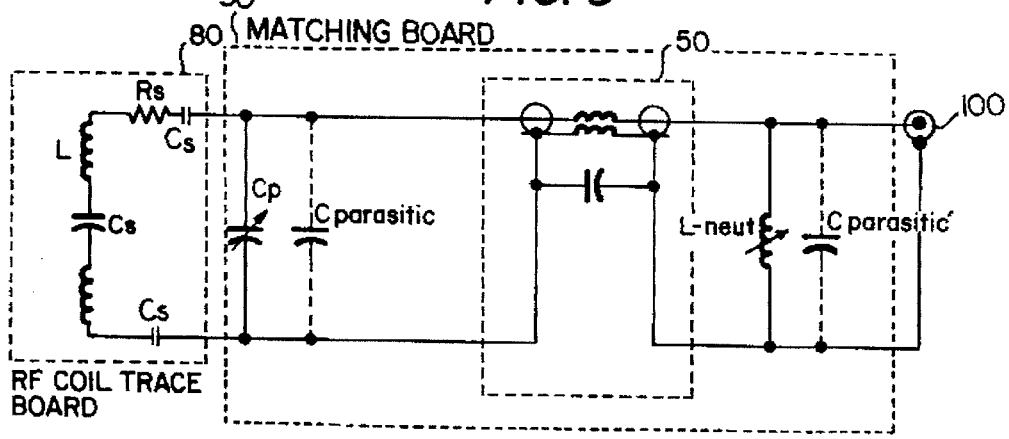
FIG. 5 is a schematic diagram of a matching circuit according to one embodiment of the present invention.
Figure 6:
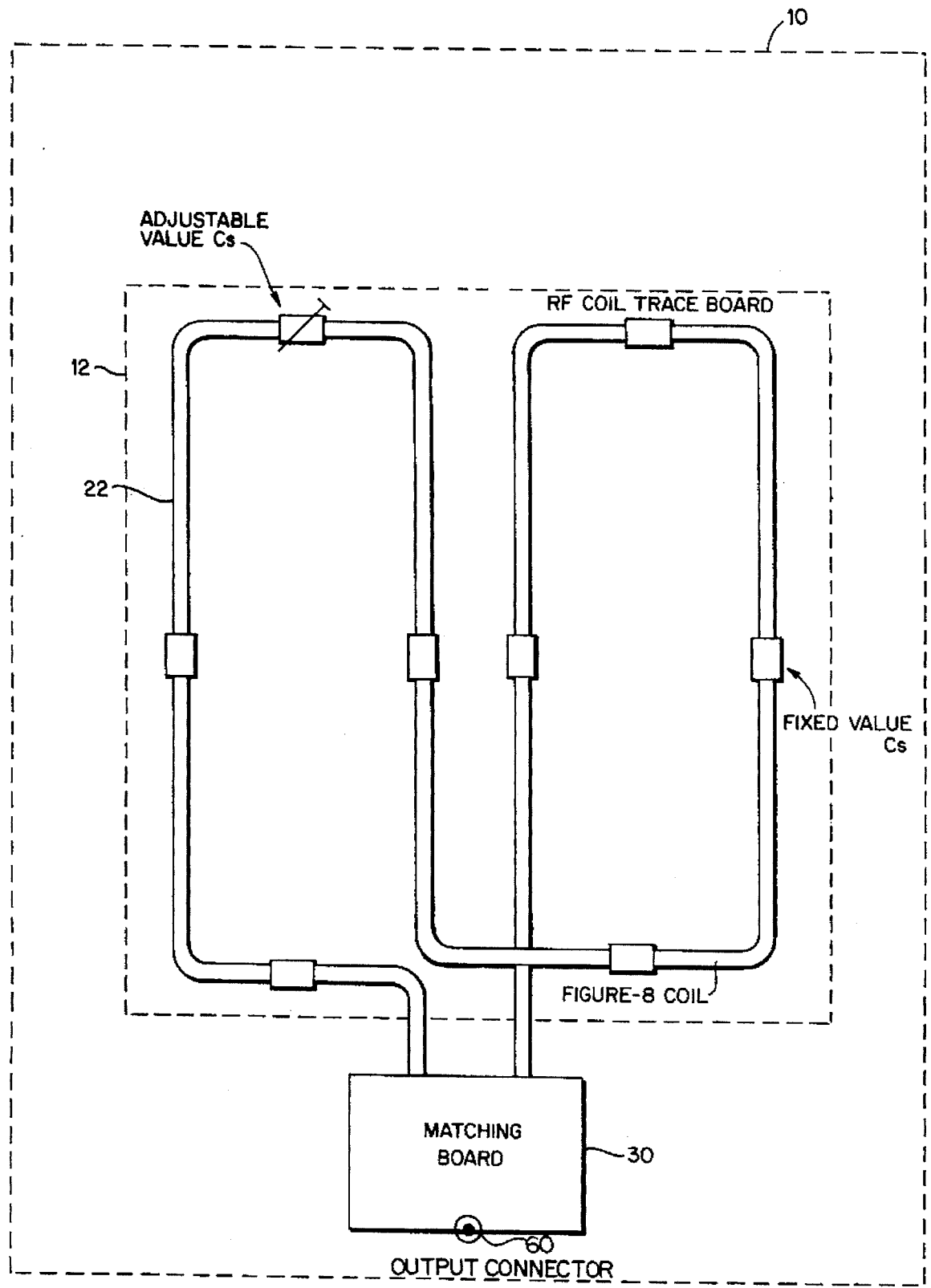
FIG. 6 is a schematic diagram of an RF coil assembly according to the circuit of FIG. 4.

One example of the present invention, as shown in FIG. 5, utilizes this concept of a neutralizing inductor within the context of the receiving coil matching circuit. The embodiment shown in FIG. 5 is particularly advantageous because it not only nulls parasitic capacitance, but also permits the removal of the variable component that may exist on the RF coil trace board 80. This provides both improved tunability (by removing the effect of the parasitic capacitance) and improved access to the tuners (by moving the variable component off of the RF coil trace board 80).

Figure 4:
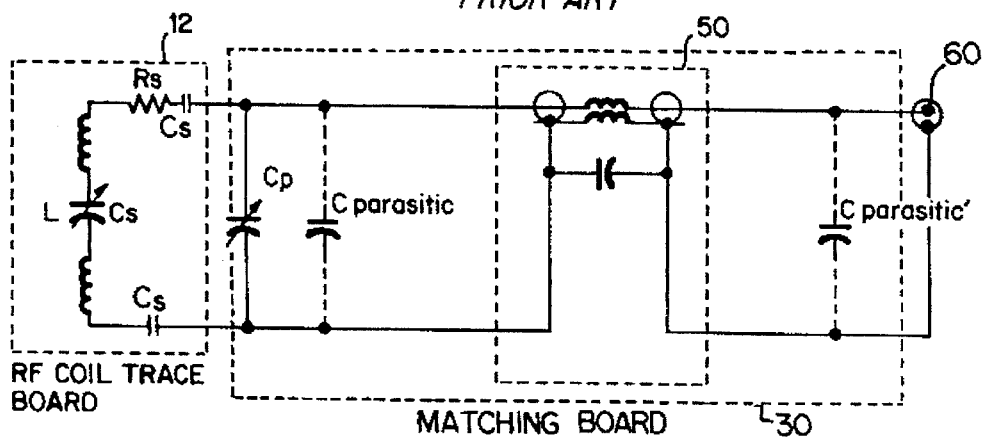
FIG. 4 is a schematic diagram of still another prior art matching circuit.

As seen in FIG. 5, the receiving coils L, the fixed value series capacitance $C_s$, and the loading resistance $R_s$ are found on the RF coil trace board 80. Unlike the RF coil trace board 12 of FIG. 4, the RF coil trace board 80 of FIG. 5 includes no variable component.

Off of the RF coil trace board 80, a variable parallel capacitance $C_p$ and the parallel parasitic capacitance $C_{parasitic}$ are shown. The ground breaker 50 is the standard ground breaker described with respect to FIG. 4 and connects the matching circuit on the left side of FIG. 5 to the RF coil output connector 100. On the output of the ground breaker 50 is a parallel neutralizing inductance $L_{neut}$ and another parallel parasitic capacitance $C_{parasitic}'$ the location of the neutralizing inductor, $L_{neut}$, can be on either side of the ground breaker 50. Placing the neutralizing inductor on the output side, however, allows the neutralizing inductor to be used as a matching control device.

Figure 8:
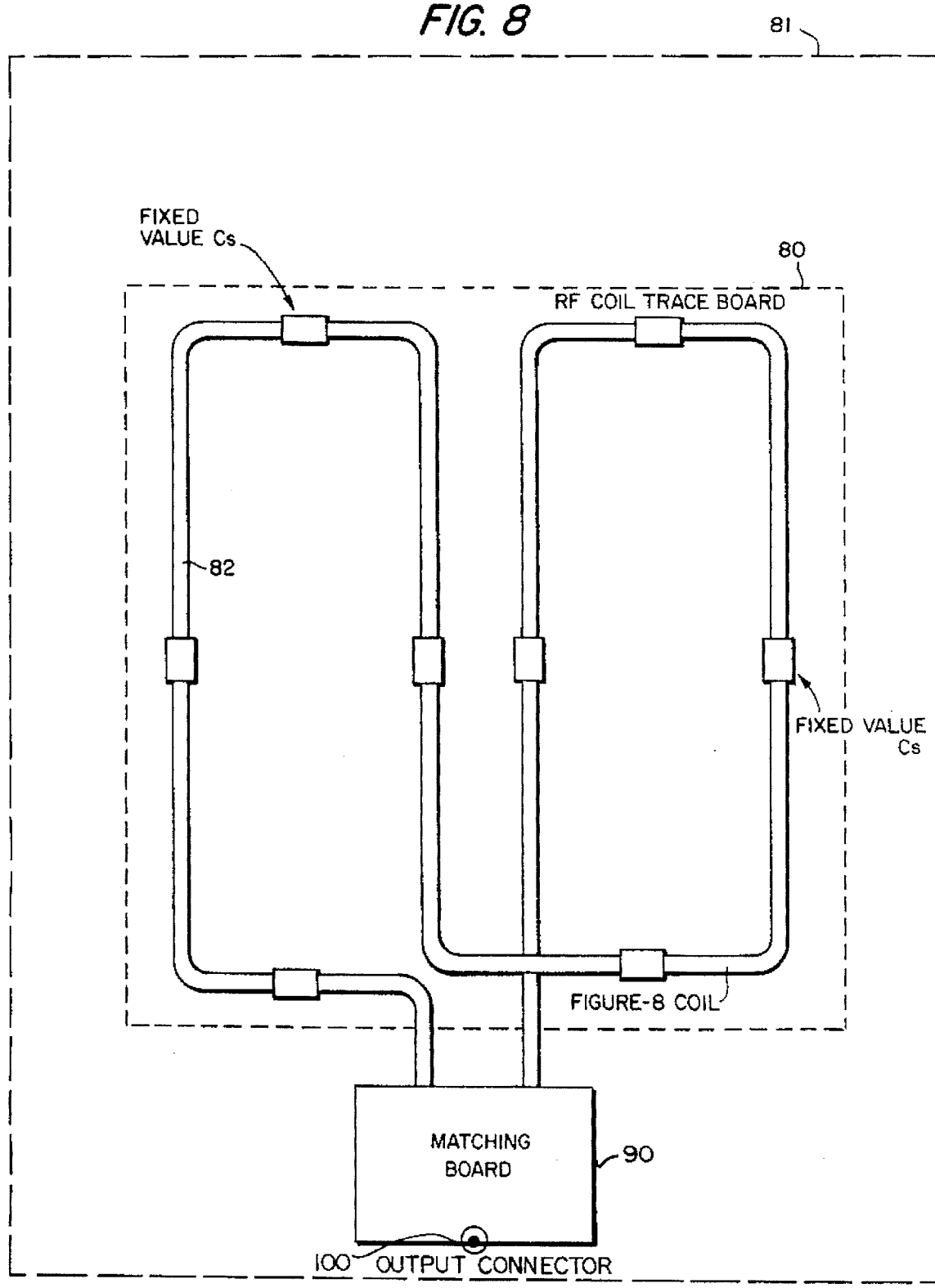
FIG. 8 is a schematic diagram of the RF coil assembly shown in the circuit of FIG. 5.

The RF coil trace board 80 corresponding to FIG. 5 is shown in FIG. 8 (note that loading resistance $R_s$ is shown only in the schematic of FIG. 5). In FIG. 8, the coil 82 is shown with fixed series capacitances $C_s$. Since each of the series capacitances $C_s$ is fixed in value and need not be adjusted during the tuning operation, access to adjustments for these capacitors is not required. In this manner, the operator of the MRI device does not need to gain access to variable capacitors on the RF coil trace board during the tuning operation.

Figure 7:
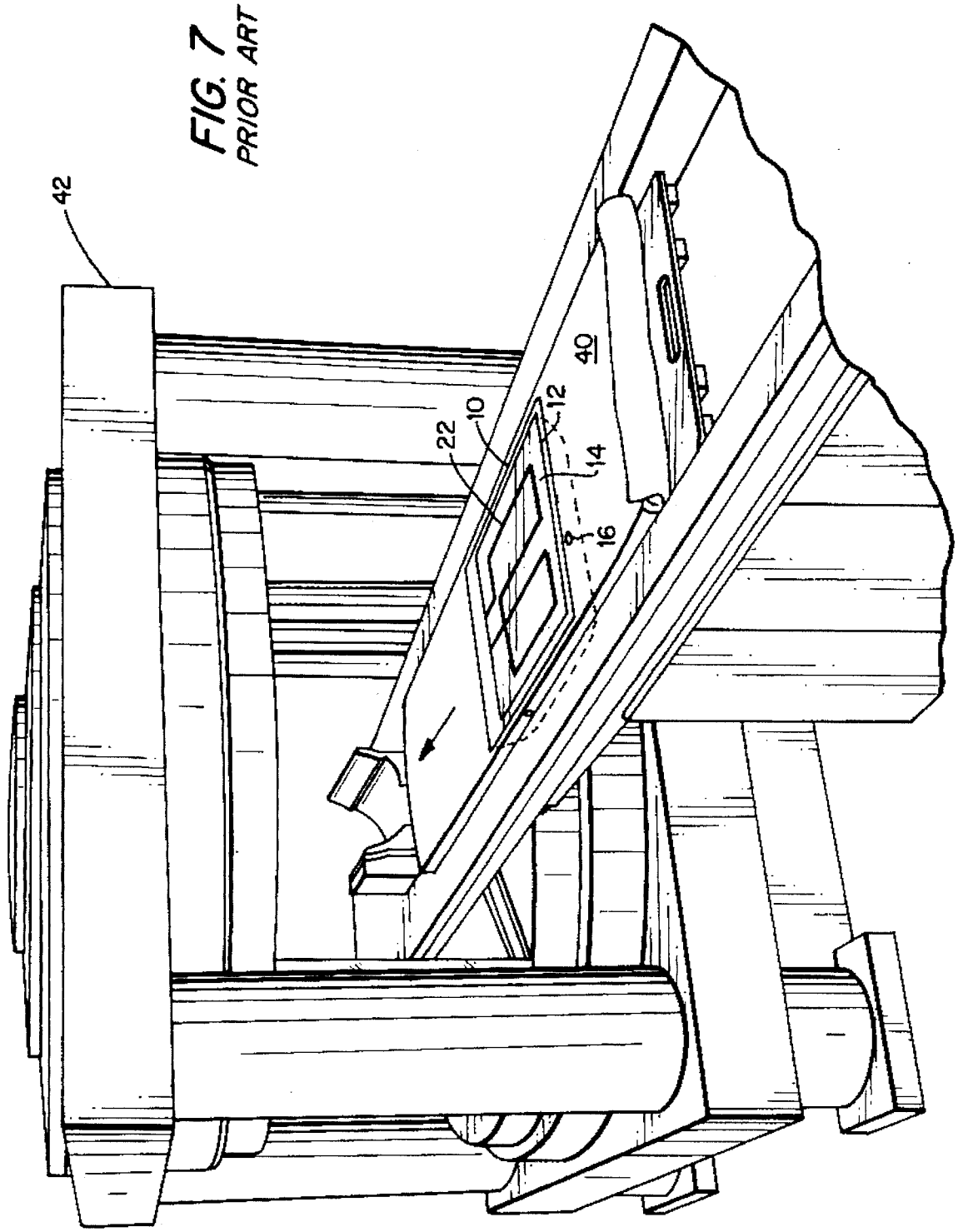
FIG. 7 is a prior art MRI assembly including the RF coil assembly of FIG. 6.

An embodiment of the present invention in an MRI system can be created by replacing the assembly 10 of FIG. 7 with the assembly 81 of FIG. 8.

Figure 9:
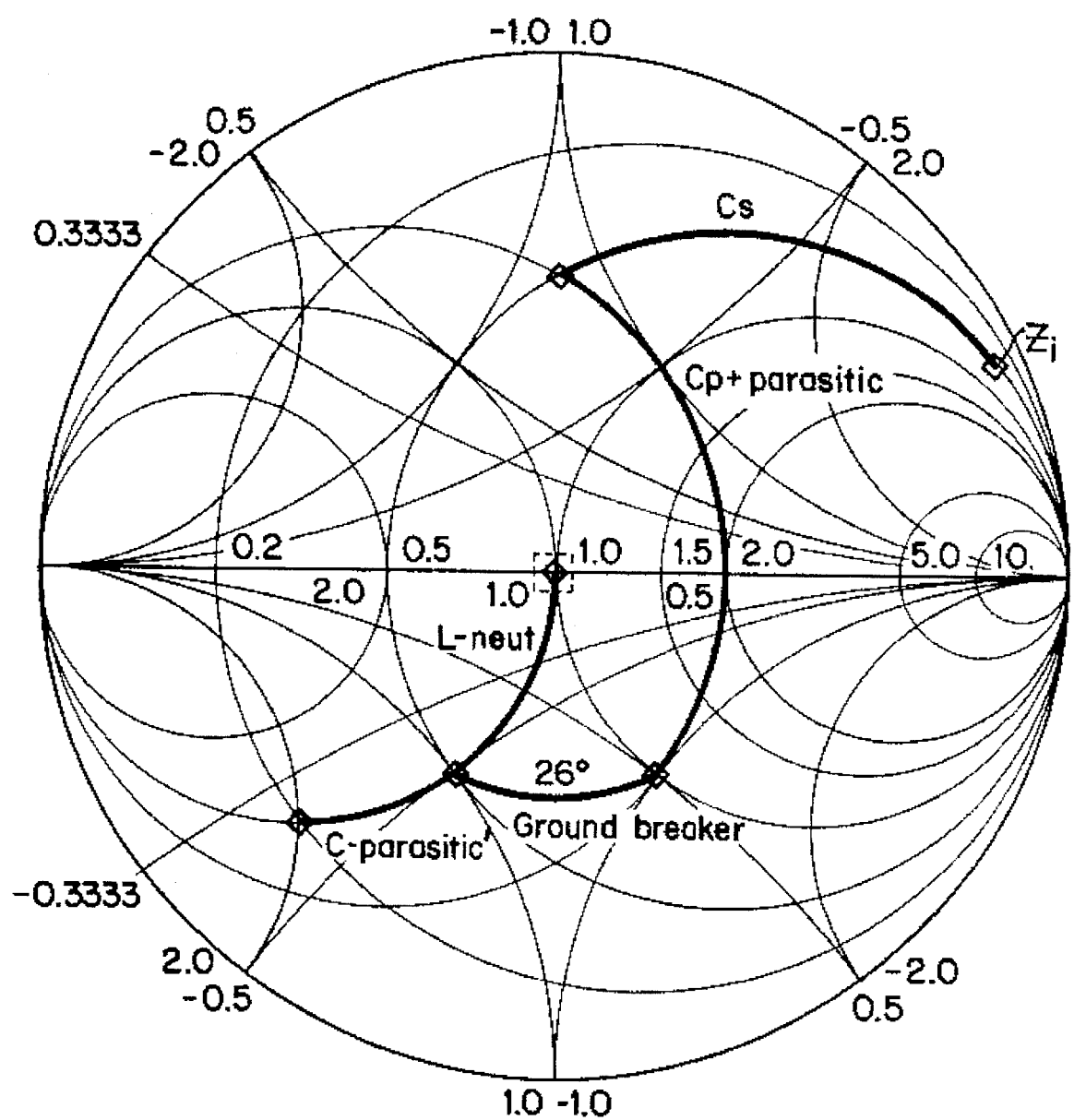
FIG. 9 is a Smith chart rendition of the circuit shown in FIG. 5.

In FIG. 9, the effect of the present matching circuit of FIG. 5 is illustrated in a Smith chart. Those familiar with Smith charts can appreciate from FIG. 9 that the $L_{neut}$ in FIG. 5 is operating both as a neutralizer for the parasitic capacitance and as a matching component. Importantly, the variable inductor, $L_{neut}$ is easily accessed by the MRI operator since it is on the matching board 90, on the output side of the ground breaker.

In FIG. 9, the initial impedance $Z_i$ is shown on the right side of the Smith chart. The contributions of the series capacitances $C_s$, the parallel capacitance $C_p$, and the parasitic capacitance $C_{parasitic}$ brings the impedance of the matching circuit below the horizontal line. The ground breaker then adds a fixed amount of phase in the clockwise direction and the second parasitic capacitance adds parallel capacitance. Finally the variable neutralizing inductor $L_{neut}$ brings the impedance to the matching point (1.0) at the center of the Smith chart circle. Variability is provided by $C_p$ and $L_{neut}$ during the tuning operation. This example shown in FIG. 9, like the previous Smith chart examples, is provided under the conditions that the coil inductance is 0.6 μH and the coil Q is 10 at 64 MHz. FIG. 9 also illustrates a case where the value of each parasitic capacitance is approximately 50 pF.

As can be seen in FIG. 5 (and the corresponding Smith chart in FIG. 9), the present embodiments, in which the neutralizing inductor is added on the output side of a ground breaker 50, can bring the impedance to the matching point (1.0 of the Smith chart) while partly neutralizing the effect of parasitic capacitance. This permits a capacitor that is present on the RF coil trace board to be fixed in value, eliminating the requirement that the operator be able to access the adjustment screw for that variable capacitor on the trace board. In addition, less costly FR4-based PC board may be used, even though it may produce greater parasitic capacitance than more expensive teflon/glass substrate based PC board. Further, the coil matching with the present invention is simpler since adjustments are made in the variable parallel capacitors and the variable inductor, at a location away from the trace board. In addition, the fixed value capacitors on the RF coil tuning boards can have higher voltage tolerances and be less expensive than variable capacitors. Thus, the chance of arcing and burning in a variable capacitor on the RF coil trace board, when subjected to a high power by the transmission coil, is eliminated.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

What is claimed is:

1. An RF coil system for magnetic resonance imaging, comprising:
   a conductive coil having an inductance and a series capacitor connected in series with the conductive coil; and
   an RF coil matching circuit comprising:
      a variable parallel capacitor connected in parallel with the series connection of the conductive coil and the series capacitor,
      a ground breaker connected in series with the variable parallel capacitor, and
      a variable parallel inductor, connected in parallel with the series connection of the variable parallel capacitor and the ground breaker.

2. An RF coil system according to claim 1, further including:
   multiple series capacitors connected in series with the conductive coil.

3. An RF coil system according to claim 1, wherein the printed circuit board induces a parasitic capacitance in parallel with the conductive coil and the variable parallel inductor is tuned to substantially null the parasitic capacitance.

4. An RF coil system for magnetic resonance imaging, comprising:
   a conductive coil printed on a printed circuit board, the conductive coil including an inductance and a series capacitor connected in series with the conductive coil; and
   an RF coil matching circuit electrically connected to the conductive coil, comprising:
      a variable parallel capacitor, off of the printed circuit board, connected in parallel with the series connection of the conductive coil and the series capacitor, and
      a ground breaker connected in series with the variable parallel capacitor, and
      a variable parallel inductor, off of the printed circuit board, connected in parallel with the series connection of the ground breaker and the variable parallel capacitor.

5. An RF coil system according to claim 4, further including:
   multiple series capacitors connected in series with the conductive coil.

6. An RF coil system according to claim 4, wherein the printed circuit board induces a parasitic capacitance in parallel with the conductive coil and the variable parallel inductor is tuned to substantially null the parasitic capacitance.

7. An RF coil, comprising:
   a conductive coil;
   a series capacitor, connected in series with the conductive coil;
   a variable parallel capacitor connected in parallel with the series connection of the series capacitor and the conductive coil;
   a ground breaker, connected in series with the variable parallel capacitor,
   a capacitor connected in parallel with the ground breaker for tuning the ground breaker;
   a variable parallel inductor, connected in parallel with the series connection of the variable parallel capacitor and the ground breaker, for tuning the conductive coil.

8. An RF coil according to claim 7, further including:
   a printed circuit board including the conductive coil and the series capacitor.

9. An RF coil according to claim 8, wherein the printed circuit board induces a parasitic capacitance in parallel with the conductive coil and the variable parallel inductor is tuned to null the parasitic capacitance.

* * * * *